(12) United States Patent
Crifasi et al.

(10) Patent No.: US 9,971,073 B2
(45) Date of Patent: May 15, 2018

(54) ENHANCED PERFORMANCE METALLIC BASED OPTICAL MIRROR SUBSTRATES

(71) Applicant: Corning Incorporated, Corning, NY (US)

(72) Inventors: Joseph Charles Crifasi, Stoddard, NH (US); Gary Allen Hart, Walworth, NY (US); Robin Merchant Walton, Redwood City, CA (US); Leonard Gerard Wamboldt, Sunderland, MA (US); Jue Wang, Fairport, NY (US)

(73) Assignee: Corning Incorporated, Corning, NY (US)

( * ) Notice: Subject to any disclaimer, the term of this patent is extended or adjusted under 35 U.S.C. 154(b) by 370 days.

(21) Appl. No.: 14/679,339

(22) Filed: Apr. 6, 2015

(65) Prior Publication Data

US 2015/0293275 A1 Oct. 15, 2015

Related U.S. Application Data

(60) Provisional application No. 61/979,161, filed on Apr. 14, 2014.

(51) Int. Cl.
*C23C 14/00* (2006.01)
*G02B 5/08* (2006.01)
(Continued)

(52) U.S. Cl.
CPC .......... *G02B 5/0875* (2013.01); *C23C 14/022* (2013.01); *C23C 14/024* (2013.01);
(Continued)

(58) Field of Classification Search
CPC .................................................. C23C 14/165
(Continued)

(56) References Cited

U.S. PATENT DOCUMENTS 5,525,199 A    6/1996 Scobey
6,921,177 B2   7/2005 Schaefer
(Continued)

OTHER PUBLICATIONS

International Search Report and Written Opinion, dated Jul. 10, 2015, pp. 1-12, International Application No. PCT/US2015/025033, International filing date Apr. 9, 2015, International Searching Authority, European Patent Office.
(Continued)

*Primary Examiner* — Timon Wanga
(74) *Attorney, Agent, or Firm* — Kevin L. Bray

(57) ABSTRACT

A method for coating substrates is provided. The method includes diamond turning a substrate to a surface roughness of between about 60 Å and about 100 Å RMS, wherein the substrate is one of a metal and a metal alloy. The method further includes polishing the diamond turned surface of the substrate to a surface roughness of between about 10 Å and about 25 Å to form a polished substrate, heating the polished substrate, and ion bombarding the substrate with an inert gas. The method includes depositing a coating including at least one metallic layer on the ion bombarded surface of the substrate using low pressure magnetron sputtering, and polishing the coating to form a finished surface having a surface roughness of less than about 25 Å RMS using a glycol based colloidal solution.

11 Claims, 1 Drawing Sheet

(51) Int. Cl.
| | |
|---|---|
| *C23C 14/35* | (2006.01) |
| *C23C 14/02* | (2006.01) |
| *C23C 14/58* | (2006.01) |
| *G02B 1/14* | (2015.01) |
| *C23C 14/16* | (2006.01) |

(52) U.S. Cl.
CPC .......... *C23C 14/028* (2013.01); *C23C 14/165* (2013.01); *C23C 14/35* (2013.01); *C23C 14/588* (2013.01); *G02B 1/14* (2015.01); *G02B 5/0808* (2013.01)

(58) Field of Classification Search
USPC ........................................ 359/360; 29/603.12
See application file for complete search history.

(56) References Cited

U.S. PATENT DOCUMENTS

| | | | |
|---|---|---|---|
| 8,251,777 | B2 | 8/2012 | Moeggenborg et al. |
| 2003/0135986 | A1* | 7/2003 | Eschbach .............. B24B 37/044 29/603.12 |
| 2004/0165296 | A1 | 8/2004 | Schaefer |
| 2004/0224521 | A1 | 11/2004 | Flake et al. |
| 2013/0057952 | A1* | 3/2013 | Risse .................... C23C 14/024 359/360 |

OTHER PUBLICATIONS

Alcoa Insert 5052 and 6061, www.alcoaconsumerelectronics.com, downloaded Feb. 24, 2015.
Surface Finishing Solutions Using High-Purity Aluminum, AlumiPlate Inc., 258 6475, httppreview.alumiplate.comwp-contentuploadsAlumiPlate-Brochure, downloaded Feb. 24, 2015.
Electroplated aluminum: The logical choice for cadmium replacement in corrosive environments. AlumiPlate Inc., 258 6475, http-preview.alumiplate.comwp-contentuploadsCadmium-Replacement, downloaded Feb. 24, 2015.
Electroplated High Purity Aluminum: provides an unsurpassed reflective surface for high performance multi spectral, high thermal stability mirrors in critical applications. AlumiPlate Inc., 258 6475, httpppreview.alumiplate.comwp-contentuploadsOptics-and-Diamond-Turning, downloaded Feb. 24, 2015.
M. S. Tillack et al., Development of Damage-Resistant Metal Mirrors for Laser-IFE, proceedings from IEE conference, Jun. 2007, 1-4244-1194-7/07.
Smoothing Out Defects for Extreme Ultraviolet Lithography, Ion-Beam Thin-Film Planarization, Lawrence Livermore National Laboratory, S&TR Sep./Oct. 2008, pp. 21-23.
Jue Wang, In Situ Plasma Smoothing of $Al_2O_3$ Films, Corning Redlines, vol. 3, No. 3, pp. 1-3.
Keith Carrigan et al., 4th Generation Aluminum Optics Performance, Proc. of SPIE, vol. 8838, 88380R-1, 2013; Downloaded From: http://proceedings.spiedigitallibrary.org/ on Apr. 2, 2015.
John P. Schaefer, Advanced metal mirror processing for tactical ISR systems, Proc. of SPIE, vol. 8713, 871306, 2013, Downloaded From: http://proceedings.spiedigitallibrary.org/ on Apr. 2, 2015.

* cited by examiner

ENHANCED PERFORMANCE METALLIC BASED OPTICAL MIRROR SUBSTRATES

This application claims the benefit of priority under 35 U.S.C. § 119 of U.S. Provisional Application Ser. No. 61/979,161 filed on Apr. 14, 2014 the content of which is relied upon and incorporated herein by reference in its entirety.

FIELD

The present disclosure is directed to mirrors and, more particularly, to the structure and fabrication of mirrors made from metal substrates.

BACKGROUND

There are a variety of optical systems in which high precision mirrors are used. Examples include ultraviolet lithography condenser mirrors, reflective laser scanner mirrors, remote sensing for homeland security, exo-atmospheric reflecting optics, high energy infrared (IR) laser systems, solar power concentrators, systems in which low scattering is needed for visible radiation, and a variety of other applications.

One technique for making precision metal mirrors is to take a substrate of an aluminum alloy, such as aluminum 6061-T6, and to carry out single point diamond turning (DPT) of a surface on the substrate, which then serves as the reflective surface. This alloy is lightweight, is easily machined by DPT, and has good long-term stability. However, the aluminum alloy contains alloy elements such as zinc, chromium and iron, which leave defects or artifacts after DPT that effectively limit the surface finish achievable with DPT. Such a surface finish provides adequately low scatter for many applications in which the reflected radiation of interest has a relatively long wavelength, such as a wavelength greater than 3.0 microns. At shorter wavelengths, however, such as the wavelength of visible radiation, such a surface finish produces a level of scatter which is too high for many applications.

Scattering is a result of corrosion, as well as a higher than desirable surface finish which exposes sites at which the alloy material may be exposed, and this results in a decrease system throughput and in reducing laser induced damage threshold (LIDT) performance. Nickel plating, and more recently an aluminum plating process called AlumiPlate® (AlumiPlate Incorporated, Minneapolis, Minn.), which is an electroplating process for depositing aluminum layers, have overcome some of the issues relating to corrosion, but not all of the issues that enable the preparation of high performance mirrors that can be used over a wide wavelength range.

Nickel plated finished optics have demonstrated enhanced corrosion resistance when exposed to harsh environment tests such as salt fog and extended humidity and have been observed to have enhanced laser damage threshold performance. However, there is an inherent mismatch between the coefficient of thermal expansion (CTE) for the aluminum alloy substrate and the CTE for the plated nickel layer. Consequently, and due to the thickness of the nickel layer, there can be a bimetallic effect between the substrate and nickel layer, which causes bending of the mirror surface in the operational temperature range of the mirror. Such bending is undesirable in the context of a high precision mirror surface because it changes optical characteristics of the mirror surface. In order to keep such bimetallic bending to an acceptable level over normal temperature variations, the plated nickel has to be a thin and uniform layer. As such, the nickel plated finished optics cannot be considered for applications having large operational temperature ranges, for example, between about −70° C. and about 60° C.

An alternative technique uses electro-deposited high purity aluminum plating instead of the nickel plating, in order to avoid the thermal mismatch. This process creates a hard aluminum oxide outer layer on the electro-deposited aluminum layer, and this oxide layer damages the diamond tool during cutting. In addition, this high purity aluminum is very soft, and tends to build up on the diamond tool during cutting, which makes the DPT operation difficult. Also, the soft, aluminum surface is easily scratched, and difficult to clean.

Yet another technique includes polishing the aluminum substrate. This is difficult because of the softness of the aluminum, although some techniques have demonstrated surface finishes of 10 Å RMS. However, bi-directional reflective distribution function (BRDF) scatter testing shows that the resulting aspheric surface on the polished 6061-T6 aluminum layer effectively performs like a 60 Å RMS surface finish, because the surface peak-to-valley variations remain very high as a result of impurities. As a result, such polishing techniques do not provide a significant improvement over the unpolished aluminum substrate.

SUMMARY

According to an embodiment of the present disclosure, a method for coating substrates is provided. The method includes diamond turning a substrate to a surface roughness of between about 60 Å and about 100 Å RMS, wherein the substrate is one of a metal and a metal alloy. The method further includes polishing the diamond turned surface of the substrate to a surface roughness of between about 10 Å and about 25 Å to form a polished substrate, heating the polished substrate, and ion bombarding the substrate with an inert gas. The method includes depositing a coating including at least one metallic layer on the ion bombarded surface of the substrate using low pressure magnetron sputtering, and polishing the coating to form a finished surface having a surface roughness of less than about 25 Å RMS using a glycol based colloidal solution.

According to another embodiment of the present disclosure, an optical mirror is provided. The optical mirror includes a substrate and a coating deposited on the metal substrate, the coating including at least one metallic layer having a finished surface roughness of less than about 25 Å RMS. The optical mirror further includes a reflective metal layer deposited on the metallic layer, and a thin film stack deposited on the reflective metal layer.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

The disclosure will be understood more clearly from the following description and from the accompanying figures, given purely by way of non-limiting example, in which.

DETAILED DESCRIPTION

According to embodiments of the present disclosure, mirrors, and a method of forming such mirrors, are provided. FIGS. 1-4 illustrate various mirrors 100, 200, 300, 400 in accordance with exemplary embodiments of the present disclosure. The mirror 100, 200, 300, 400 includes a substrate 110, 210, 310, 410 which may be, without limitation, a glass, a glass-ceramic, a ceramic or a metallic substrate. The substrate 110, 210, 310, 410 may be a silica substrate, for example, but without limitation, fused silica. Metallic substrates may be, without limitation, aluminum, aluminum alloys, magnesium and magnesium alloys. As an example, the aluminum alloy may be, without limitation, 6061-T6 Al alloy.

The mirror 100, 200, 300, 400 further includes a coating deposited on the surface of the substrate. The coating includes at least one metallic layer 120, 220, 320, 420 which may be deposited on the substrate 110, 210, 310, 410. The metallic layer 120, 220, 320, 420 may be selected such that there is a minimal difference between the CTE of the metallic layer 120, 220, 320, 420 and the CTE of the substrate 110, 210, 310, 410 and such that thermal distortions or bending of the mirror surface are minimized in the operational temperature range of the mirror. The metallic layer 120, 220, 320, 420 may be for example, without limitation, aluminum or an aluminum alloy. The metallic layer may have a thickness of between about 2.0 µm and about 10.0 µm. Alternatively, the metallic layer 120, 220, 320, 420 may have a thickness of between about 3.0 µm and about 8.0 µm. According to embodiments of the present disclosure, the metallic layer 120, 220, 320, 420 has a surface roughness of less than about 25 Å RMS.

Figure 1:
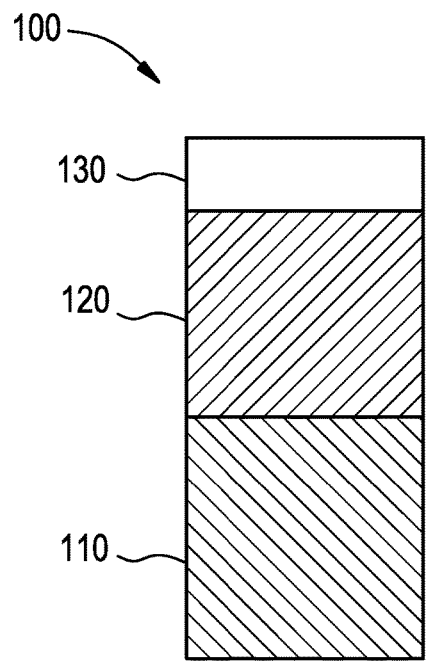
FIG. 1 shows a mirror in accordance with an embodiment of the present disclosure.
Figure 2:
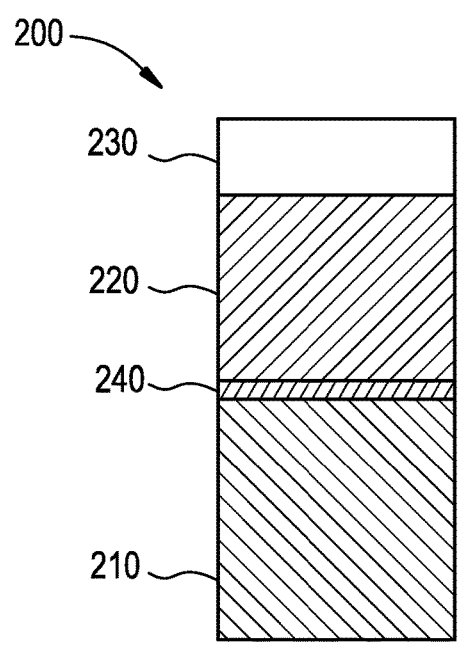
FIG. 2 shows a mirror in accordance with an embodiment of the present disclosure.
Figure 3:
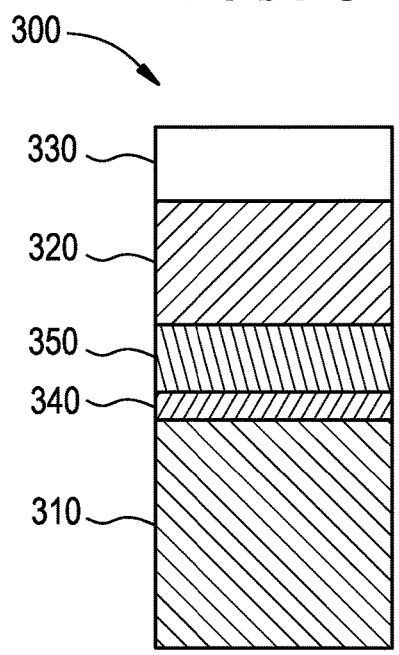
FIG. 3 shows a mirror in accordance with an embodiment of the present disclosure.
Figure 4:
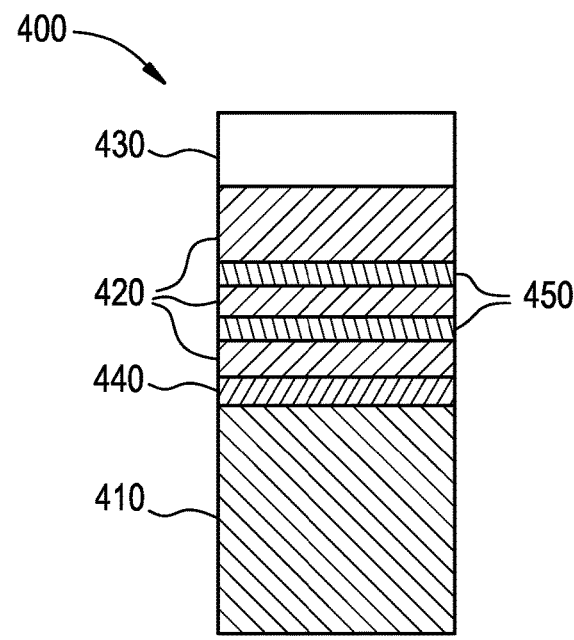
FIG. 4 shows a mirror in accordance with an embodiment of the present disclosure.

The coating may optionally include an adhesion layer 240, 340, 440 deposited on the surface of the substrate. The adhesion layer 240, 340, 440 may be included to improve bonding of the various coating layers to the substrate 110, 210, 310, 410. Where an adhesion layer 240, 340, 440 is included, the adhesion layer 240, 340, 440 may be, but is not limited to, Ni, Cr, NiCr, Ti, $Al_2O_3$, Bi, $Bi_2O_3$ or combinations thereof. The adhesion layer 240, 340, 440 may have a thickness of between about 5.0 nm and about 50 nm. As shown in FIGS. 2-4, where an adhesion layer 240, 340, 440 is included, the at least one metallic layer 220, 320, 420 is deposited on the adhesion layer 240, 340, 440.

As shown in FIG. 3, the coating may optionally include an intermediate layer 350 deposited on the adhesion layer 340. The intermediate layer 350 may be included to enhance the chemical and mechanical durability of the mirror. Where an intermediate layer 350 is included, the intermediate layer 350 may be, but is not limited to, aluminum oxide, aluminum nitride and aluminum oxynitride. The intermediate layer 350 may have a thickness of between about 1.0 µm and about 2.0 µm. As shown in FIG. 3, where an intermediate layer 350 is included, the at least one metallic layer 320 is deposited on the intermediate layer 350 and has a thickness of at least about 2.0 µm.

As shown in FIG. 4, the coating may optionally include at least one smoothing layer 450 deposited on the at least one metallic layer 420. The smoothing layer 450 may be, but is not limited to, aluminum oxide or silica oxide, and may have a thickness of greater than about 100 nm. Where at least one smoothing layer 450 is included, the at least one metallic layer 420 is deposited on the at least one smoothing layer 450 and has a thickness of at least about 2.0 µm. As a non-limiting example, FIG. 4 shows a mirror 400 in accordance with an embodiment of the present disclosure. As shown, the mirror 400 in FIG. 4 includes a substrate 410 and a coating having an adhesion layer 440 deposited on the substrate 410, a first metallic layer 420 deposited on the adhesion layer 440, a first smoothing layer 450 deposited on the first metallic layer 420, a second metallic layer 420 deposited on the first smoothing layer 450, a second smoothing layer 450 deposited on the second metallic layer 420, a third metallic layer 420 deposited on the second smoothing layer 450, and a thin film stack 430 deposited on the third metallic layer 420. FIG. 4 shows just one example of a coating having at least one smoothing layer 450. Coatings in accordance with the present disclosure may include any number of metallic layers and smoothing layers. The smoothing layers 450 may be included to provide a smooth surface underlying the at least one metallic layer 420, which promotes a smooth surface of the at least one metallic layer 420 deposited on the smoothing layer 450.

The coating further includes a thin film stack 130, 230, 330, 430. The thin film stack 130, 230, 330, 430 includes at least one thin film layer and a reflective metal layer. The reflective metal layer may be for example, without limitation, zero valent Ag, Au, Rh, Cu, Pt, or Ni. The reflective metal layer may have a thickness of the between about 75 nm and about 350 nm. The reflective metal layer may be deposited on the outermost layer of the at least one metallic layer 120, 220, 320, 420. Alternatively, the thin film stack 130, 230, 330, 430 may include a thin film that improves adhesion of the reflective metal layer to the coating. The thin film that improves adhesion may be, for example, $Al_2O_3$.

The thin film stack 130, 230, 330, 430 may include a protective layer which may be, but is not limited to, AlON, SiON, $YbF_3$, $YbF_xO_y$, $YF_3$, $Si_3N_4$ and combinations thereof. The protective layer may have a thickness of between about 60 nm and about 200 nm. Where the thin film stack 130, 230, 330, 430 includes at least two thin film layers, the protective layer is the outermost thin film layer of the thin film stack 130, 230, 330, 430. Furthermore, where the thin film stack 130, 230, 330, 430 includes at least two thin film layers, a tuning layer may be deposited between the reflective metal layer and the protective layer of the thin film stack 130, 230, 330, 430. The tuning layer may be, without limitation, $YbF_3$, $YbF_xO_y$, $YF_3$, $GdF_3$, $Ta_2O_5$, $Bi_2O_3$, or combinations thereof. The tuning layer may have a thickness of between about 75 nm and about 300 nm. Additionally, an interface layer may be deposited between the reflective metal layer and the tuning layer of the thin film stack 130, 230, 330, 430. The interface layer may be, without limitation, $Nb_2O_5$, $TiO_2$, Ta$_2$O$_5$, Bi$_2$O$_3$, ZnS, Al$_2$O$_3$, or combinations thereof. The interface layer may have a thickness of between about 5.0 nm and about 20 nm.

The mirrors disclosed herein may have a reflectivity of at least about 94% over the wavelength range of about 400 nm to about 1700 nm. The mirrors may also have a reflectivity of at least about 96% over the wavelength range of about 800 nm to about 1700 nm.

Methods in accordance with embodiments of the present disclosure include diamond turning a substrate to a surface roughness of between about 60 Å RMS and about 100 Å RMS. According to an embodiment of the present disclosure, the method may further include polishing the surface of the diamond turned substrate to a surface roughness of less than about 25 Å, for example, between about 10 Å and about 25 Å, to form a polished substrate. Alternatively, the diamond turned substrate surface may not be polished.

The method further includes heating the polished substrate to a temperature between about 50° C. and about 150° C., for example, between about 80° C. and about 110° C., for a period of between about 1.0 hour and about 2.0 hours. The method further includes ion bombarding the polished substrate with an inert gas (for example, argon) for a period of between about 15 minutes and about 30 minutes. The method further includes depositing a coating including at least one metallic layer on the surface of the ion bombarded substrate using low pressure magnetron sputtering. Low pressure magnetron sputtering may be performed in accordance with the methods disclosed in U.S. Pat. No. 5,525,199, the specification of which is incorporated by reference in its entirety. The method may also optionally include depositing an adhesion layer on the surface of the polished substrate prior to the deposition of the at least one metallic layer.

The method may also optionally include depositing at least one intermediate layer on the adhesion layer. Additionally, the method may optionally include depositing at least one smoothing layer between at least two metallic layers. Where at least one smoothing layer is deposited, at least one metallic layer is deposited on top of the smoothing layer so that the smoothing layer is not removed during the polishing steps of the method disclosed herein.

The method further includes polishing the at least one metallic layer using a glycol based colloidal solution having a slightly basic pH to form a surface roughness of less than about 25 Å RMS. It is believed that the slightly basic pH may dissolve at least some of the aluminum surface oxidation that occurs on the mirror substrate. The pH of the glycol based colloidal solution may be in the range of about 8.5 to about 9.5. Alternatively, the pH of the glycol based colloidal solution may be in the range of about 8.9 and about 9.2. Polishing may be done using a polishing pad that is a conformal tool that can be made from pitch, wax, resin, felt, polyurethane, PoliTex™ (commercially available from The Dow Chemical Company, Midland, Mich.) and/or other known polishing pad materials. Such polishing may also result in a surface having a peak to valley (PV) roughness of less than about 30 nm, for example, in the range of about 10 nm to about 30 nm. As used herein, PV roughness is the difference between the highest peak and the lowest valley on a phase plot of the surface of the mirror. In contrast to the method described herein, the use of a water-based solution may result in micro-pitting and a PV roughness of greater than about 30 nm. Such micro-pitting causes scattering of light at lower visible-near UV wavelengths.

Optionally, the method may also include smoothing at least one of the layers of the coating. Smoothing techniques may include, for example, off-normal incidence angle ion bombardment such as high angle ion bombardment, and using source masking to minimize high angle deposition. Smoothing techniques may be employed to smooth any number of layers of the coating.

The method may further include depositing a reflective metal layer on the coating. According to embodiments of the present disclosure, the method includes depositing the reflective metal layer on the outermost layer of the at least one metallic layer of the coating. The method may further include depositing a thin film stack on the reflective metal layer. The thin film stack includes at least one thin film layer.

Embodiments disclosed herein facilitate the fabrication of mirrors having an average surface roughness of less than about 25 Å RMS. As compared to mirrors with diamond turned substrate surfaces, mirrors formed in accordance with embodiments of the present disclosure were observed to have reduced scattering of reflected radiation over a wide wavelength range. Furthermore, mirrors having coatings according to embodiments of the present disclosure have minimal difference between the CTE of the metallic layer and the CTE of the substrate, which minimizes thermal distortions and bending of the mirror surface in the operational temperature range of the mirror. This is applicable to mirror applications having large operational temperature ranges, for example, between about −70° C. and about 60° C.

Mirrors disclosed herein also have improved corrosion resistance and enhanced laser damage threshold performance. As described in the examples below, mirrors according to embodiments of the present disclosure demonstrate enhanced corrosion resistance when exposed to harsh environment tests such as salt fog and extended humidity.

EXAMPLES

Embodiments of the present disclosure are further described below with respect to certain exemplary and specific embodiments thereof, which are illustrative only and not intended to be limiting.

Example 1

Four sample mirror substrates were prepared and laser induced damage threshold (LIDT) testing was performed on the four samples. The four samples included 6061-T6 Al substrates. The substrate surfaces of Samples S1 and S2 were diamond turned and polished. A reflective metal layer was deposited on Sample S2, and a thin film stack was deposited on the reflective metal layer. The substrates of Samples S3 and S4 were diamond turned and then polished. The polished substrates were heated; ion bombarded with an inert gas; and coatings including metallic layers were deposited on the polished substrates using low pressure magnetron sputtering. The coatings were polished using a glycol based colloidal solution to form finished surfaces having a surface roughness of less than about 25 Å RMS. A reflective metal layer was deposited on the coating of Sample S4, and a thin film stack was deposited on the reflective metal layer. The same reflective metal layers and thin film stacks were deposited on Samples S2 and S4.

The LIDT test was performed using an Nd-YAG laser at a wavelength of 1064 nm, an angle of incidence of 45° and a pulse repetition frequency (PRF) of 20 Hz. Table I shows the results of the LIDT testing. As shown, mirror substrates formed in accordance with embodiments of the present disclosure were observed to exhibit enhanced laser damage threshold performance. For example, Sample S3, which was processed in accordance with the method disclosed herein, exhibited an LIDT that was greater than the LIDT of Sample S1, which was diamond turned and polished, by a factor of ten. Similarly, Sample S4, which was processed in accordance with the method disclosed herein, exhibited an LIDT that was greater than the LIDT of Sample S2, which was diamond turned and polished, by a factor of greater than 2.

TABLE I

| SAMPLE | LIDT RESULT (J/cm$^2$) |
|---|---|
| S1 | 0.25 |
| S2 | 1.50 |
| S3 | 2.50 |
| S4 | 3.25 |

Example 2

Mirrors were coated in accordance with embodiments of the present disclosure. Substrates were diamond turned to a surface roughness of between about 60 Å and about 100 Å RMS, and then polished to a surface roughness of less than about 25 Å. The polished substrates were then heated to a temperature of between about 80° C. and about 110° C. for a period of between about 1.0 hour and about 2.0 hours. The polished substrate was then ion bombarded with argon for a period of between about 15 minutes and about 30 minutes. An adhesion layer having a thickness of between about 5.0 nm and about 50 nm was deposited on the ion bombarded surface. A metallic coating having a thickness of about 6.0 μm was then deposited on the adhesion layer. Deposition of the various layers was performed at a rate of less than about 2.0 Å per second. Process pressures were between about $2.0 \times 10^{-4}$ torr and about $6.0 \times 10^{-4}$ torr, and the substrates were ion bombarded during deposition with average Argon ion beam densities of between about 0.5 mA/cm$^2$ and about 1.0 mA/cm$^2$.

The coatings were observed to maintain adhesion to the substrates, and to the other layers of the coatings, after the coating method was completed. The adhesion was also maintained after the coated mirrors were further subjected to finishing solutions for between about 24 hours and about 48 hours. Post-finishing, the surface roughness and the PV roughness of the surfaces of the mirrors were measured. The surface roughness of the surfaces was determined to be between about 10 Å to about 25 Å, and the PV was determined to be between about 10 nm and about 30 nm.

Example 3

Two mirrors were prepared in accordance with the mirrors described in Example 2 and a reflective metal layer was deposited on the coating. Different thin film stacks were deposited on each of the reflective metal layers of the two mirrors. The first thin film stack included, in sequence, $Al_2O_3$—Ag—$Al_2O_3$—$YbF_xO_y$—$Ta_2O_5$—$YbF_xO_y$. The second thin film stack included, in sequence, $Al_2O_3$—Ag—$Al_2O_3$—$SiO_2$. Reflectivity of each of the mirrors was measured and was observed to be greater than at least about 94% over the wavelength range of about 400 nm to about 1700 nm, greater than at least about 96% over the wavelength range of about 800 nm to about 1700 nm, and greater than about 98% over the wavelength range of about 900 nm to about 1700 nm.

While the foregoing embodiments have been set forth for the purpose of illustration, the foregoing description should not be deemed to be a limitation on the scope of the disclosure. Accordingly, various modifications, adaptations, and alternatives may occur to one skilled in the art without departing from the spirit and scope of the present disclosure.

What is claimed is:

1. A method for coating substrates, the method comprising:
    diamond turning a substrate to a surface roughness of between about 60 Å and about 100 Å RMS, wherein the substrate is one of a metal and a metal alloy;
    polishing the diamond turned surface of the substrate to a surface roughness of between about 10 Å and about 25 Å to form a polished substrate;
    heating the polished substrate;
    ion bombarding the polished substrate with an inert gas;
    depositing a coating comprising at least one metallic layer on the ion bombarded surface of the polished substrate using low pressure magnetron sputtering; and
    polishing the coating to form a finished surface having a surface roughness of less than about 25 Å RMS using a glycol based colloidal solution.

2. The method of claim 1, wherein the substrate is selected from the group consisting of aluminum, aluminum alloys, magnesium and magnesium alloys.

3. The method of claim 1, wherein the metallic layer comprises a material selected from the group consisting of aluminum, aluminum alloys, magnesium and magnesium alloys.

4. The method of claim 1, wherein the coating has a thickness of between about 2.0 μm and about 10 μm.

5. The method of claim 1, wherein the glycol based colloidal solution has a pH of between about 8.5 and about 9.5.

6. The method of claim 1, wherein the finished surface has a peak to valley (PV) roughness of less than about 30 nm.

7. The method of claim 1, wherein depositing a coating further comprises depositing an adhesion layer on the ion bombarded surface of the polished substrate and depositing the metallic layer on the adhesion layer.

8. The method of claim 7, wherein depositing a coating further comprises depositing an intermediate layer on the adhesion layer, the intermediate layer comprising a material selected from the group consisting of an aluminum oxide, aluminum nitride and aluminum oxynitride.

9. The method of claim 1, further comprising depositing at least one smoothing layer, the at least one smoothing layer comprising aluminum oxide.

10. The method of claim 1, wherein the polished substrate is heated to a temperature between 50° C. and 150° C. for a time period between 1.0 hour and 2.0 hours.

11. The method of claim 1, wherein the polished substrate is ion bombarded with the inert gas for a time period between 15 min and 30 min.

* * * * *